(12) United States Patent
Minnis

(10) Patent No.: US 6,826,237 B1
(45) Date of Patent: Nov. 30, 2004

(54) RADIO TRANSMITTER

(75) Inventor: Brian J. Minnis, Crawley (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/395,013

(22) Filed: Sep. 13, 1999

(30) Foreign Application Priority Data

Sep. 30, 1998 (GB) .............................................. 9821088

(51) Int. Cl.$^7$ .............................................. H04L 27/12
(52) U.S. Cl. ............................... 375/302; 375/308
(58) Field of Search .............................. 375/308, 295, 375/297, 298, 261, 279, 302–307; 455/20–23, 42, 43, 63.1, 102, 110, 111, 112, 113, 118

(56) References Cited

U.S. PATENT DOCUMENTS

| | | | | |
|---|---|---|---|---|
| 4,262,361 A | * | 4/1981 | Hauer .......................... | 455/113 |
| 4,809,203 A | * | 2/1989 | Wilson et al. .............. | 370/497 |
| 5,483,695 A | * | 1/1996 | Pardoen ...................... | 455/314 |
| 5,548,541 A | * | 8/1996 | Bierman et al. ............ | 375/308 |
| 5,673,291 A | * | 9/1997 | Dent ........................... | 375/262 |
| 5,748,623 A | * | 5/1998 | Sawahashi et al. ......... | 370/342 |
| 5,812,605 A | * | 9/1998 | Smith et al. ................ | 375/308 |
| 6,072,994 A | * | 6/2000 | Phillips et al. .............. | 375/295 |
| 6,091,780 A | * | 7/2000 | Sointula ...................... | 375/295 |

* cited by examiner

Primary Examiner—Don N. Vo
(74) Attorney, Agent, or Firm—Dicran Halajian

(57) ABSTRACT

A radio transmitter for multi-standard mobile communication systems has two stages of frequency up-conversion, the first being a digital process generating a variable IF and the second being an analogue conversion using a fixed frequency local oscillator, which alleviates the need for RF filtering after the final stage of power amplification. The IF frequency band is symmetrical about zero frequency and thus includes negative frequencies.

17 Claims, 2 Drawing Sheets

RADIO TRANSMITTER

FIELD OF THE INVENTION

The present invention relates to a radio transmitter having particular, but not exclusive, application in digital communication systems such as GSM.

BACKGROUND OF THE INVENTION

The GSM specification for spurious emissions from a mobile station transmitter, as defined in the European Telecommunication Standards Institute (ETSI) document "GSM: Digital Cellular Telecommunications System (Phase 2) Radio Transmission and Receptions (GSM 05.05 version 4.19.0)", is summarised in FIG. 1 of the accompanying drawings. The figure plots the permitted levels of unwanted noise N in a 1 Hz bandwidth, referenced to a carrier power level of +33 dBm at 902 MHz, against frequency f in MHz. Also shown are the positions of the GSM transmit (Tx) and receive (Rx) bands. In the portion of the GSM receive band between 925 and 935 MHz the noise must be held below −150 dBc, and in the portion between 935 and 960 MHz the noise must be held below −162 dBc. Such low levels of noise are difficult to achieve with a fully-integrated transmitter, and to meet this specification with a conventional architecture it is necessary to use an expensive RF filter after the final stage of power amplification, with a consequent loss of transmitter efficiency.

A block diagram of a conventional transmitter architecture, which performs dual up-conversion in analogue circuitry, is shown in FIG. 2 of the accompanying drawings. Digital data for transmission is provided as an input 202 to a Gaussian Minimum Shift Keying (GMSK) modulator 204 which produces as output analogue in-phase I and quadrature phase Q signals on a zero-frequency carrier. The I signal is supplied to a first IF mixer 206, and the Q signal is supplied to a second IF mixer 208. An output signal from a first Voltage Controlled Oscillator (VCO) 210 is supplied via a first 90° phase shifter 212 to the local oscillator port of the first IF mixer 206, and directly to the local oscillator port of the second IF mixer 208. The resultant output signals from the mixers 206, 208 are added together by a combiner 214 and filtered in a bandpass filter 222 to produce a signal at the required IF frequency, for example 100 MHz. As well as removing unwanted mixing products the bandpass IF filter 222 reduces levels of out-of-band noise. The filter 222 is commonly implemented off-chip.

The first VCO 210 is driven by a signal produced by an IF synthesiser 216 which derives its output using a 13 MHz reference oscillator 218 under the control of instructions passed on a control bus 220 to produce a fixed IF output.

The filtered IF signal is split into two parts. The first part has its phase shifted 90° by a second phase shifter 224 and is then up-converted by a first RF mixer 226, the second part of the IF signal is up-converted by a second RF mixer 228. An output signal from a second VCO 230 is supplied directly to the local oscillator port of the second RF mixer 228, and via a third 90° phase shifter 232 to the local oscillator port of the first RF mixer 226. The resultant output signals from the mixers 226, 228 are added together by a combiner 234 to produce a combined RF signal including a product at the required frequency in the GSM transmit band between 880 and 915 MHz.

The second VCO 230 is driven by a signal produced by an RF synthesiser 236 which derives its output using a 13 MHz reference oscillator 218 under the control of instructions passed on a control bus 220 to produce a variable output frequency.

Without extra filtering, noise from the second VCO 230 would fall into the GSM receive band at an unacceptably high level. The RF signal therefore passes through a first RF bandpass filter 238 before being amplified for transmission by a power amplifier 240. The amplifier 240 is normally operated under heavy compression for best efficiency, and this has the effect of removing the AM component of single-sideband noise on the input signal. Without the AM component, the residual FM component produces noise at equal levels on the two sides of the signal, largely restoring noise in the unwanted sideband. Hence the signal must be filtered by a second RF bandpass filter 242 before transmission via an antenna 244. The second RF filter 242 is much less desirable than the first filter 238 both in terms of cost (because of the higher power levels it must handle) and because of the resultant loss in transmitter power due to losses in the filter 242. These transmitter losses can amount to more than 1 W, requiring the use of a bigger power amplifier 240 and a larger battery.

Such an architecture therefore has a number of disadvantages for use with current digital cellular communications standards. It is difficult to use for telephones operating in accordance with two or more standards unless the schemes are compatible (in the sense of having similar requirements for bandwidth and modulation schemes, for example). This is because only the baseband circuitry is digital, and the analogue IF and RF circuitry is inherently less flexible. Also, as mentioned above, it is difficult to meet the GSM requirements for spurious emissions without additional filtering after the power amplification stage.

SUMMARY OF THE INVENTION

An object of the present invention is to address the problems described above.

According to the present invention there is provided a radio transmitter comprising modulation means for producing quadrature modulated signals, first frequency-translation means for translating said signals to a variable intermediate frequency (IF) signal in digital form, digital to analogue conversion means for converting said variable IF signal to analogue form, second frequency-translation means for translating said analogue IF signal by a fixed frequency to a radio frequency (RF) signal, and power amplifying means for amplifying said RF signal for transmission.

The present invention is based upon the recognition, not present in the prior art, that digital up-conversion to a variable IF provides a more flexible transmitter architecture that does not require expensive RF filtering.

An advantage of the described transmitter architecture is that it is extremely versatile, giving the possibility of changing modulation methods, frequencies, sampling rates or bandwidths to accommodate a variety of communication standards.

Advantageously, error correction means are provided between the first and second frequency translation means, to correct for the imbalance between in-phase and quadrature signals in the second frequency translation means.

Provision of such means enables automatic calibration of the transmitter during manufacture to take account of the imbalance between signal paths in the second frequency-translation means, after which calibration no further attention is required.

BRIEF DESCRIPTION OF THE DRAWINGS

Embodiments of the present invention will now be described, by way of example, with reference to the accompanying drawings, wherein.

In the drawings the same reference numerals have been used to indicate corresponding features.

DETAILED DESCRIPTION OF THE INVENTION

Figure 1:
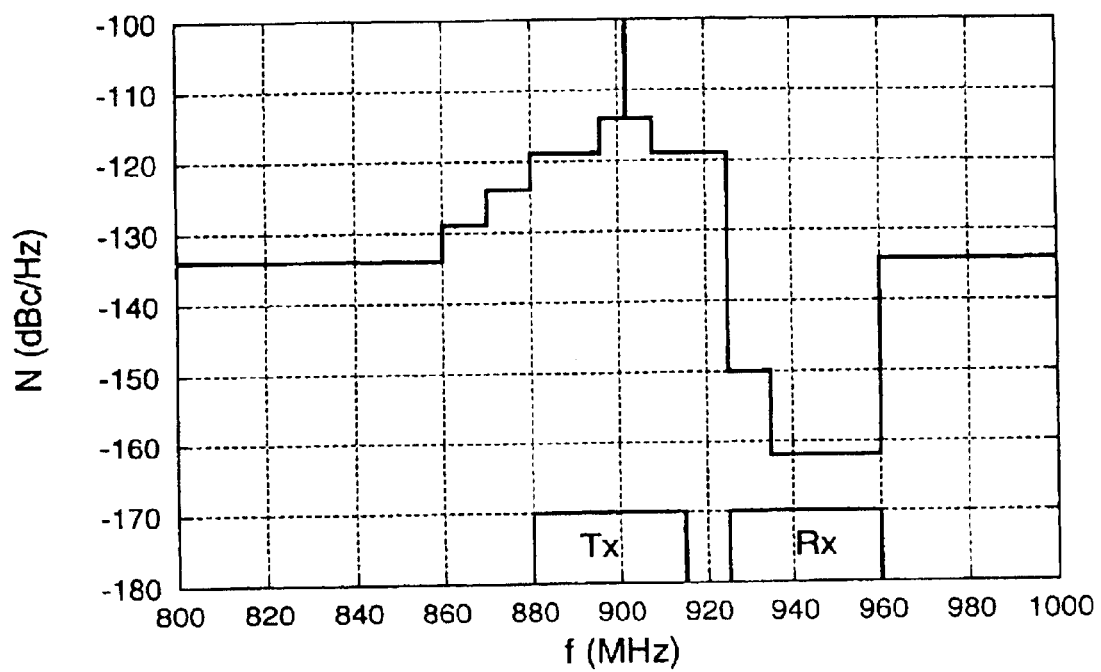
FIG. 1 is a graph of frequency f, in MHz, versus noise, N, in dBc/Hz, illustrating the GSM specification for spurious emissions, as described above.
Figure 2:
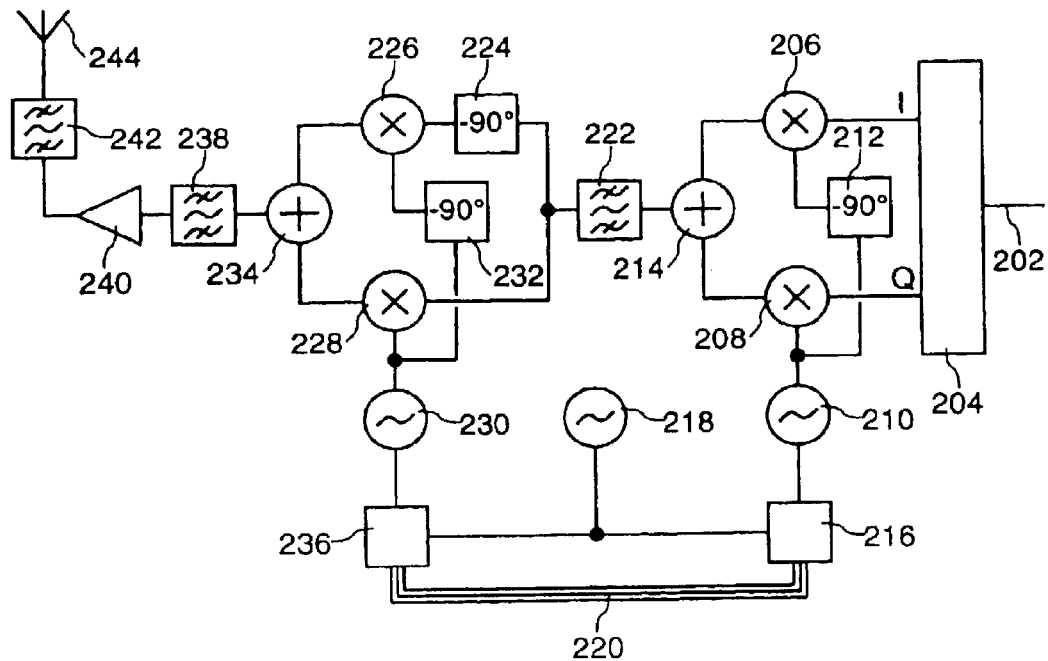
FIG. 2 is a block diagram of a conventional transmitter architecture, as described above.
Figure 3:
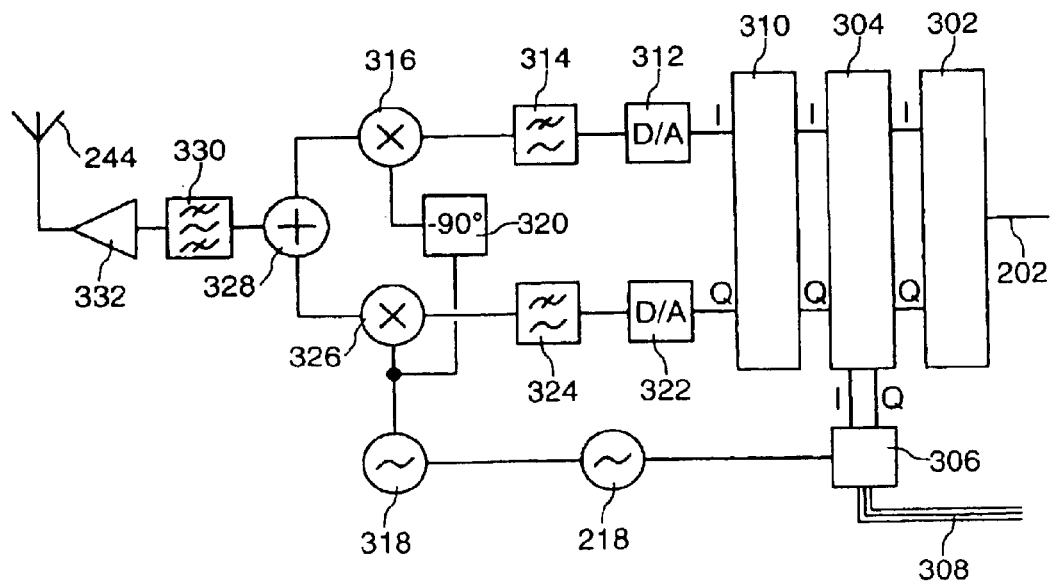
FIG. 3 is a block diagram of a transmitter architecture designed in accordance with the present invention.

An embodiment of a transmitter architecture designed in accordance with the present invention is shown in FIG. 3. The basic concept is to make a first up-conversion a variable frequency conversion in the digital domain and a second a fixed frequency conversion in the analogue domain.

Digital data is provided as input 202 to a digital GMSK modulator 302. The output of the modulator 302 is digitised I and Q signals on a zero-IF carrier at the GSM bit rate of 270833 bits per second. The signals are then processed by a digital up-conversion and filtering block 304, which mixes the signals up to a variable IF of between −17.5 and +17.5 MHz. This is a purely digital process incorporating the necessary digital filtering. The up-rotation I and Q signals are derived from an IF synthesiser 306, which receives control signals via a control bus 308.

The tuning range reflects that required in the transmitter output for the GSM transmitter band. The use of a symmetrical range extending into negative frequencies keeps the IF as low as possible to minimise power consumption. As a consequence of the use of negative frequencies it is essential to process complex signals throughout the transmitter chain. The sampling rate after up-conversion must be at least 35 MHz to avoid aliasing.

Following this first up-conversion the signals pass through a digital error correction module 310, discussed in more detail below. After suitable error corrections have been applied the I and Q digital signals are converted into analogue form by first and second digital to analogue converters 312, 322 and then filtered by first and second analogue lowpass filters 314, 324, having a bandwidth of approximately 17.5 MHz. The filters 314, 324 can be low Q devices, capable of being implemented as active devices on-chip.

The filtered signals are then translated directly to the transmitter output frequency, the I signal being mixed by a first mixer 316 with an output signal from a fixed-frequency VCO 318 via a 90° phase shifter 320 and the Q signal being mixed by a second mixer 326 with the output signal from the VCO 318. Advantages of using a fixed frequency VCO 318 include:

the VCO 318 does not require a multi-step synthesiser;
the design of the 90° phase shifter 320 is considerably simplified; and
the balance of the mixers is easier to ensure with a fixed-frequency local oscillator.

The two RF signals are combined by an adder 328, after which the combined signals are filtered in an RF bandpass filter 330 to eliminate mixer spurious responses and reduce the levels of wideband noise. The signal is amplified by a power amplifier 332 and relayed to an antenna 244 for transmission. If the quality of the RF filter 330 is sufficiently high no additional filtering after the power amplifier 332 will be required.

It may be possible to eliminate the RF filter 330 if the fixed-frequency VCO 318 has a much higher Q than a tunable version and thereby generates lower levels of noise with less DC power consumption. However, the improvement in noise is in close-to-carrier noise performance rather than the level of noise at large frequency offsets, which is dominated by DC power consumption. Therefore to ensure that the transmitter noise is not degraded by the VCO with no RF filter 330 it would be necessary to make the VCO a relatively high power device.

Another issue relating to eliminating the RF filter 330 is that of the noise associated with the mixers 316, 326. If the mixers have a noise figure of nominally 10 dB, and if the noise floor for the modulated signals driving the mixers 316, 326 is close to the theoretical limit of −174 dBm/Hz, the equivalent noise of the mixers at a 20 MHz offset cannot be below approximately −164 dBm/Hz. This in turn means that in order to achieve the desired −162 dBc/Hz of the GSM specification without the RF filter 330 the signal drive to the mixers 316, 326 would have to be about 0 dBm. Such a high level drive is not desirable if the spurious responses are to be kept under control, which is also necessary.

Hence, for most applications the disadvantages of eliminating the RF filter 330 will outweigh the advantage of lower component count.

The function of the digital error correction block 310 is to compensate for imperfections in the analogue front-end mixers 316, 326. As in any practical integrated circuit, processing imperfections will lead to slight imbalances of the I and Q signal paths through the two analogue mixers 316, 326. A fixed frequency local oscillator 318 should have been minimised these imbalances, but such are the constraints placed on the transmitter by the GSM specification that some error correction facility is likely to be required. The error correction block 310 applies suitable corrections in real time in the digital domain. An automatic calibration would be performed at the end of the manufacturing process of the product incorporating the transmitter, in which the transmitter output would be optimised for minimum spurious outputs. Once the correction terms had been computed they would be down-loaded into static memory in the error correction block 310. After this process the error correction circuitry could correct for the imbalances in the mixers 316, 326, assuming these imperfections remained constant with time.

The fixed frequency local oscillator 318 also helps to address another important requirement, that of maintaining the balance of the two mixers 316, 326 at the Local Oscillator (LO) ports. These must be held to tight tolerances to avoid the breakthrough of the LO signal into the transmitted signal.

If local oscillator pulling is a difficulty for channels selected in the middle of the GSM frequency range, it would be possible to change the IF frequency range from one of −17.5 MHz to +17.5 MHz to one of approximately zero to 35 MHz. This would move the local oscillator frequency out of the range of the transmitter and alleviate any pulling.

The architecture described above is extremely versatile and, with the inclusion of the RF filter 330, noise should not be a problem even without a duplexer filter at the antenna 244. All the signal processing elements between the input data stream 202 and the output of the error correction block 310 are implemented digitally, either in dedicated hardware or in software. Hence it is comparatively easy to change the modulation method, the frequencies, the sampling rates or the bandwidths to accommodate different communication standards from GSM. If the functions are implemented entirely in software, true multi-mode operation becomes a realistic proposition. The predominance of digital circuitry also offers a better prospect for using CMOS instead of the more expensive BiCMOS integrated circuit technologies, and no off-chip IF filtering is required.

An important advantage of the architecture is that is able to accommodate both constant and non-constant envelope modulation schemes as a consequence of avoiding the use of a phase-locked VCO. This may be particularly important for GSM if there is any move towards a non-constant envelope modulation scheme for higher bit rate traffic.

The architecture has good potential for dual-band operation in both the 800/900 MHz frequency bands and the 1800/1900 MHz bands without the need for heavy duplication of RF components. It may only be necessary to add a second, fixed frequency VCO, an RF filter and appropriate switches.

Although the present invention has been described with reference to the GSM cellular telecommunications system it will be apparent that it is equally applicable to other telecommunications systems, whether cellular or not.

From reading the present disclosure, other modifications will be apparent to persons skilled in the art. Such modifications may involve other features which are already known in radio transmitters, and which may be used instead of or in addition to features already described herein.

In the present specification and claims the word "a" or "an" preceding an element does not exclude the presence of a plurality of such elements. Further, the word "comprising" does not exclude the presence of other elements or steps than those listed.

What is claimed is:

1. A radio transmitter comprising modulation means for producing quadrature modulated signals, first frequency-translation means for translating said signals to a variable intermediate frequency (IF) signal in digital form in an IF frequency band, digital to analogue conversion means for converting said variable IF signal to analogue form, second frequency-translation means for translating said analogue IF signal by a fixed frequency to a radio frequency (RF) signal, said fixed frequency being provided by a fixed frequency voltage controlled oscillator (VCO) source, reference oscillator means having an output, power amplifying means for amplifying said RF signal to form an amplified signal, and signal propagation means for propagating said amplified signal, wherein said first frequency-translation means includes a digital up-converter configured to receive signals from an IF synthesizer, and wherein said output of said reference oscillator means is connected to said IF synthesizer and said fixed frequency VCO.

2. A transmitter as claimed in claim 1, wherein the IF frequency band is symmetrical about zero frequency.

3. A transmitter as claimed in claim 1, further comprising error correction means between the first and second frequency-translation means, to correct for the imbalance between in-phase and quadrature signals in the second frequency-translation means.

4. A transmitter as claimed in claim 1, wherein filtering means are coupled between the second frequency-translation means and the power amplifying means.

5. A transmitter as claimed in claim 1, wherein the modulation means are under software control.

6. A transmitter as claimed in claim 1, wherein the first frequency-translation means are under software control.

7. A transmitter as claimed in claim 1, wherein said variable IF signal is sampled at a sampling rate of at least 35 MHz.

8. A transmitter as claimed in claim 1, wherein the IF frequency band ranges from 0 Hz to an upper limit.

9. The transmitter of claim 1, wherein the IF frequency band includes negative frequencies.

10. The radio transmitter of claim 1, wherein said signal propagation means is directly connected to said power amplifying means without an element between said signal propagation means said power amplifier means.

11. A transmitter comprising:
a modulator which modulates a digital input signal to form a modulated signal;
a digital up-converter configured to perform a conversion of said modulated signal to a variable intermediate frequency (IF) signal within an IF band having an in-phase component and a quadrature component, said digital up-converter being configured to receive signals from an IF synthesizer to perform said conversion;
a converter which converts said IF signal to an analog IF signal having an in-phase IF analog component and a quadrature IF analog component;
a first mixer device which translates said in-phase IF analog component to a radio frequency (RF) signal by mixing said in-phase IF analog component with a fixed frequency from a fixed frequency voltage controlled oscillator (VCO); and
a second mixer device which translates said quadrature phase IF analog component to said radio frequency (RF) signal by mixing said quadrature phase IF analog component with said fixed frequency from said fixed frequency VCO;
a reference oscillator having an output connected to said IF synthesizer and said fixed frequency VCO;
a power amplifier which amplifies said RF signal to form an amplified signal; and
an antenna which is configured to receive said amplified signal for transmission.

12. The transmitter of claim 11, wherein the IF frequency band is symmetrical about zero frequency.

13. The transmitter of claim 11, wherein said IF signal is sampled at a sampling rate of at least 35 MHz.

14. The transmitter of claim 11, wherein the IF frequency band includes negative frequencies.

15. The transmitter of claim 11, wherein said antenna is directly connected to said power amplifier without an element between said antenna said power amplifier.

16. A transmitter comprising:
a modulator which modulates a digital input signal to form a modulated signal;
a digital up-converter configured to perform a conversion of said modulated signal to an intermediate frequency (IF) signal, said digital up-converter being configured to receive signals from an IF synthesizer to perform said conversion;
a converter configured to convert said IF signal to an analog IF signal;
an analog up-converter configured to convert said analog IF signal to a radio frequency (RF) signal by mixing said analog IF signal with a fixed frequency from a fixed frequency voltage controlled oscillator (VCO);
a reference oscillator having an output connected to said IF synthesizer and said fixed frequency VCO;
a power amplifier which amplifies said RF signal to output an amplified signal; and
an antenna which is configured to receive said amplified signal for transmission.

17. The transmitter of claim 16, wherein said antenna is directly connected to said power amplifier without an element between said antenna said power amplifier.

* * * * *